(12) United States Patent
Yoo et al.

(10) Patent No.: US 7,638,885 B2
(45) Date of Patent: Dec. 29, 2009

(54) FABRIC TYPE SEMICONDUCTOR DEVICE PACKAGE AND METHODS OF INSTALLING AND MANUFACTURING SAME

(75) Inventors: Hoi-Jun Yoo, Daejeon (KR); Yongsang Kim, Daejeon (KR); Hyejung Kim, Daejeon (KR)

(73) Assignee: Korea Advanced Institute of Science & Technology, Daejeon (KR)

( * ) Notice: Subject to any disclaimer, the term of this patent is extended or adjusted under 35 U.S.C. 154(b) by 55 days.

(21) Appl. No.: 12/037,203

(22) Filed: Feb. 26, 2008

(65) Prior Publication Data

US 2008/0258314 A1 Oct. 23, 2008

(30) Foreign Application Priority Data

Apr. 18, 2007 (KR) .................... 10-2007-0037792
Jan. 10, 2008 (KR) .................... 10-2008-0002949

(51) Int. Cl.
*H01L 23/49* (2006.01)
*H01L 21/56* (2006.01)
(52) U.S. Cl. ............... 257/784; 257/787; 257/E23.024; 257/E21.502; 438/119

(58) Field of Classification Search .................. None
See application file for complete search history.

(56) References Cited

U.S. PATENT DOCUMENTS

2006/0289469 A1* 12/2006 Chandra et al. ............. 219/528

* cited by examiner

*Primary Examiner*—Evan Pert
*Assistant Examiner*—Whitney Moore
(74) *Attorney, Agent, or Firm*—Barry E. Negrin; Pryor Cashman LLP

(57) ABSTRACT

A fabric type semiconductor device package is provided. The fabric type semiconductor device package comprises a fabric type printed circuit board comprising a fabric and a lead unit formed by patterning a conductive material on the fabric, a semiconductor device comprising an electrode unit bonded to the lead unit of the fabric type printed circuit board, and a molding unit for sealing the fabric type printed circuit board and the semiconductor device. In the fabric type semiconductor device package according to the present invention, a fabric type printed circuit board formed of fabric is used so that a feeling of an alien substance can be minimized. The fabric type semiconductor device package can be easily installed. The productivity of the fabric type semiconductor device package can be improved.

18 Claims, 10 Drawing Sheets

100'

100   110

13

15

17

21

23

25

27

29

31

33

FABRIC TYPE SEMICONDUCTOR DEVICE PACKAGE AND METHODS OF INSTALLING AND MANUFACTURING SAME

This non-provisional application claims priority under 35 U.S.C. §119(a) on Patent Application No 10-2008-0002949 filed in Korea on Jan. 14, 2008 and patent Application No 10-2007-0037792 filed in Korea on Apr. 18, 2007, the entire contents of which are hereby incorporated by reference.

BACKGROUND OF THE INVENTION

1. Field of the Invention

The present invention relates to a fabric type semiconductor device package and methods of installing and manufacturing the same.

2. Description of the Background Art

Recently, interest in a wearable computer in which various digital apparatuses and functions required for daily lives are integrated with clothing has been increased. Currently, the parts of a computer are dispersed to be arranged in clothing. However, as mobile telephones are made small, have multiple functions, and conductive fiber is developed, a wearable computer for providing functions of computers in the form of clothing may be realized while a user doesn't recognize the fact.

In this status, it is difficult to minimize a portable device and to minimize foreign body sensation when the portable device is inserted into the clothing in the conventional semiconductor device packaging and a method of manufacturing a printed circuit board. In order to solve this problem, a flexible circuit board for a liquid display module is developed, however, it is still inconvenient to install the portable device in the clothing and to wear the clothing. In a case of electrically wiring a conductive fiber to fabric, since ends of the conductive fiber must be connected to the semiconductor packages by manually soldering one by one, it is difficult to automate and productivity is deteriorated.

SUMMARY OF THE INVENTION

Accordingly, the present invention is directed to provide a fabric type semiconductor device package capable of minimizing a feeling of an alien substance in clothing and of improving productivity and methods of installing and manufacturing the same.

A fabric type semiconductor device package according to the present invention comprises: a fabric type printed circuit board comprising a fabric and a lead unit formed by patterning a conductive material on the fabric; a semiconductor device comprising an electrode unit bonded to the lead unit of the fabric type printed circuit board; and a molding unit for sealing the fabric type printed circuit board and the semiconductor device.

The electrode unit of the semiconductor device and the lead unit of the fabric type printed circuit board are wire-bonded to each other.

The fabric type semiconductor device package further comprises a metal plate formed on the lead unit of the fabric type printed circuit board, and the electrode unit of the semiconductor device and the metal plate of the fabric type printed circuit board are wire-bonded to each other.

The electrode unit of the semiconductor device or the lead unit of the fabric type printed circuit board comprises a protrusion, and the electrode unit of the semiconductor device and the lead unit of the fabric type printed circuit board are bonded to each other by a flip chip bonding.

The semiconductor device comprises at least one of a semiconductor device chip, a passive device, and an IC chipset.

The fabric type printed circuit board comprises a via hole; the molding unit is formed in the via hole, and the upper and lower sides of the fabric type printed circuit board; and a molding region formed in the upper side of the fabric type printed circuit board and a molding region formed in the lower side of the fabric type printed circuit board are connected to each other by a molding region formed in the via hole.

A method of installing the fabric type semiconductor device package on clothes by sewing the fabric type printed circuit board on the clothes using a conductive fiber.

A step of installing the fabric type semiconductor device package comprises: removing a coating layer of the conductive fiber using a knife or laser such that a part of a conductor of the conductive fiber which is sewed on the clothes is exposed; and bonding the exposed conductor to the lead unit of the fabric type printed circuit board with a conductive adhesive.

A step of installing the fabric type semiconductor device package comprises sewing the lead unit of the fabric type printed circuit board, to which the semiconductor device is bonded, to a lead pattern of another fabric type printed circuit board with the fiber when the lead unit of the fabric type printed circuit board contacts the lead pattern of another fabric type printed circuit board.

A method of manufacturing a fabric type semiconductor device package according to the present invention comprises: (a) forming a fabric type printed circuit board comprising forming a lead unit by patterning a conductive material on a fabric; (b) bonding an electrode unit of a semiconductor device to the lead unit of the fabric type printed circuit board; and (c) forming a molding unit of sealing the fabric type printed circuit board and the semiconductor device.

The forming of the lead unit comprises: arranging a screen mask with a pattern corresponding to a pattern of the lead unit on the fabric; and coating the conductive material on the fabric through the screen mask.

The conductive material comprises silver, polymer, solvent, polyester, and cyclohexanone.

The forming of the lead unit comprises: generating plasma by colliding a sputtering gas against a target material in a high vacuum status; and vapor-depositing the plasma on the fabric type printed circuit board through a mask with a pattern corresponding to the pattern of the lead unit.

The semiconductor device comprises at least one of a semiconductor chip, a passive device, and an IC chipset.

The step (b) comprises: coating a liquid epoxy on the fabric type printed circuit board; bonding the semiconductor device on the fabric type printed circuit board coated with the liquid epoxy and bonding a wire to the electrode unit of the semiconductor device; and bonding the wire bonded to the electrode unit of the semiconductor device to the lead unit of the fabric type printed circuit board.

The step (b) comprises: bonding a metal plate to the lead unit of the fabric type printed circuit board and bonding the semiconductor device to the metal plate; bonding a wire to the electrode unit of the semiconductor device bonded to the metal plate; and bonding the wire bonded to the electrode unit of the semiconductor device to the metal plate.

In the step (b), the lead unit of the fabric type printed circuit board and the electrode unit of the semiconductor device are bonded to each other in a flip chip bonding.

The step (c) comprises: forming a plurality of holes in the fabric type printed circuit board to which the semiconductor device is bonded; and forming the molding unit such that the upper and lower sides of the fabric type printed circuit board to which the semiconductor device is bonded are connected to each other through the holes.

In the fabric type semiconductor device package according to the present invention, a fabric type printed circuit board (PCB) formed of fabric is used so that a feeling of an alien substance can be minimized.

In addition, the fabric type semiconductor device package can be easily installed.

In addition, the productivity of the fabric type semiconductor device package can be improved.

DETAILED DESCRIPTION OF EXEMPLARY EMBODIMENTS

Hereinafter, a fabric type semiconductor device package according to an exemplary embodiment of the present invention will be described with reference to the accompanying drawings.

FIGS. 1 to 4 illustrate a fabric type semiconductor device package according to an embodiment of the present invention.

Figure 1:
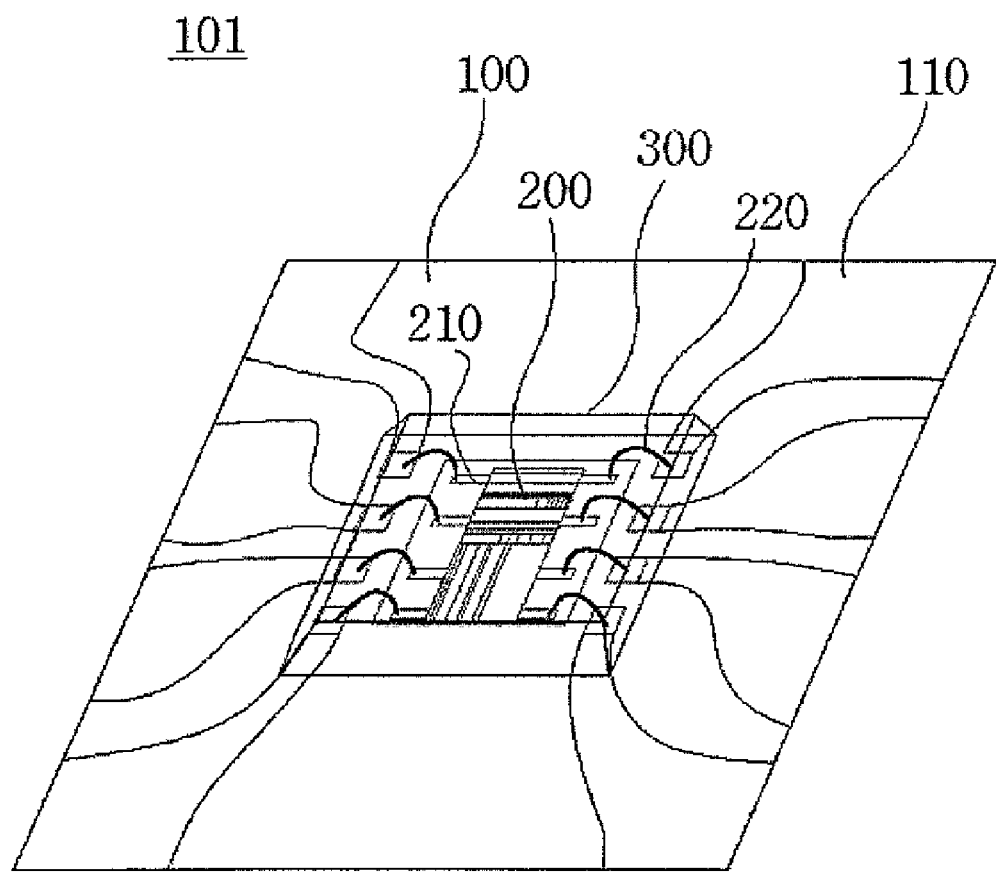
FIGS. 1 to 4 illustrate a fabric type semiconductor device package according to an embodiment of the present invention.

Referring to FIG. 1, a fabric type semiconductor device package 101 according to the present invention comprises a fabric type printed circuit board (PCB) 100 comprising a fabric and a lead unit 110 formed by patterning a conductive material on the fabric, a semiconductor device 200 comprising electrode units 210 bonded to the lead unit 110 of the fabric type PCB 100, and a molding unit 300 for sealing up the fabric type PCB 100 and the semiconductor device 200.

The fabric type PCB 100 comprises the lead unit 110 formed by patterning the conductive material on the fabric. The lead unit 110 can be formed by depositing or applying the conductive material on the fabric using a mask.

The fabric type PCB 100 and the semiconductor device 200 can be wire bonded. As illustrated in FIG. 1, the lead unit 110 of the fabric type PCB 100 and the electrode units 210 of the semiconductor device 200 can be wire bonded by wires 220. In addition, a metal plate can be formed on the lead unit 110 of the fabric type PCB 100. Therefore, the metal plate and the electrode unit 210 of the semiconductor device can be wire bonded by the wires.

Figure 2:
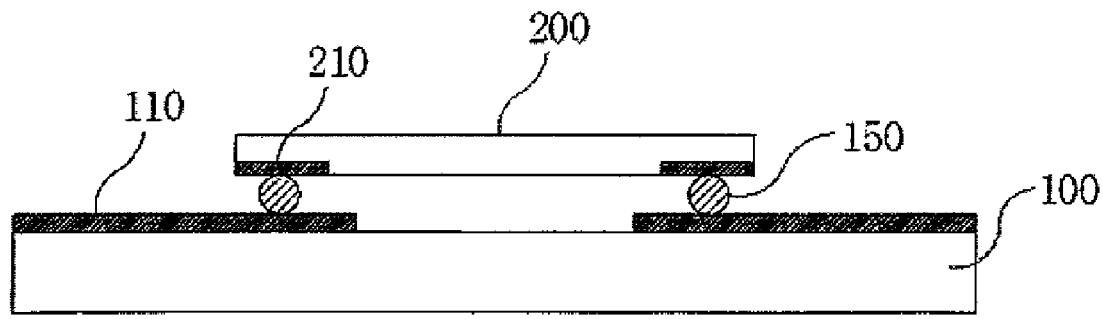

The fabric type PCB 100 and the semiconductor device 200 can be flip chip bonded. As illustrated in FIG. 2, additional protruding units 130 are formed on the lead unit 110 of the fabric type PCB 100 or on the electrode unit 210 of the semiconductor device 200. Therefore, the electrode unit 210 of the semiconductor device 200 and the lead unit 110 of the fabric type PCB 100 can be flip chip bonded by the protruding units 150.

Figure 3:
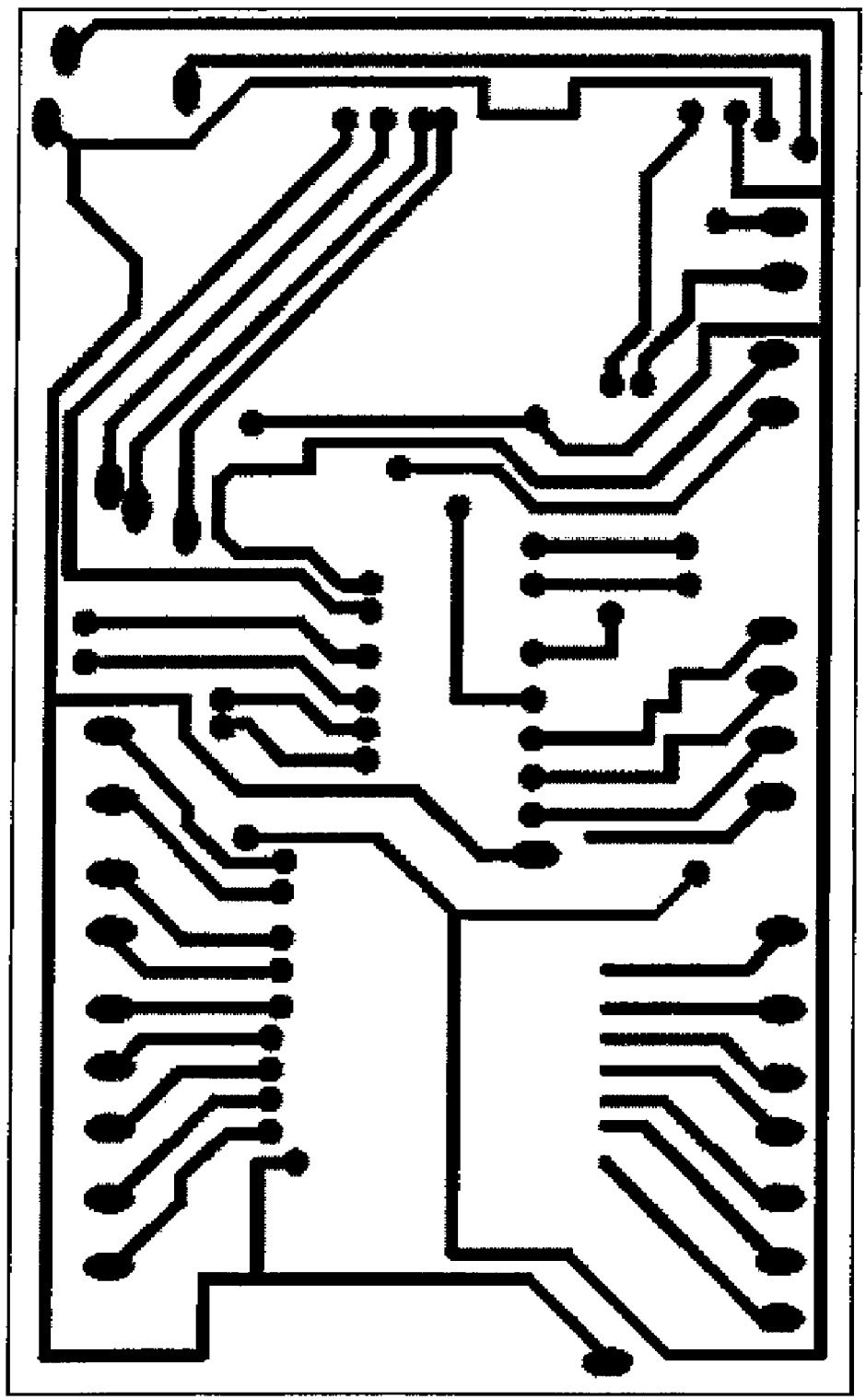

At least one of a semiconductor chip, a passive device, and an integrated circuit chipset can be comprised in the semiconductor device bonded to the fabric type PCB. Therefore, as illustrated in FIG. 3, a fabric type PCE 100' having various lead patterns can be used so that a plurality of passive devices or integrated circuit chipsets can be mounted.

Figure 4:
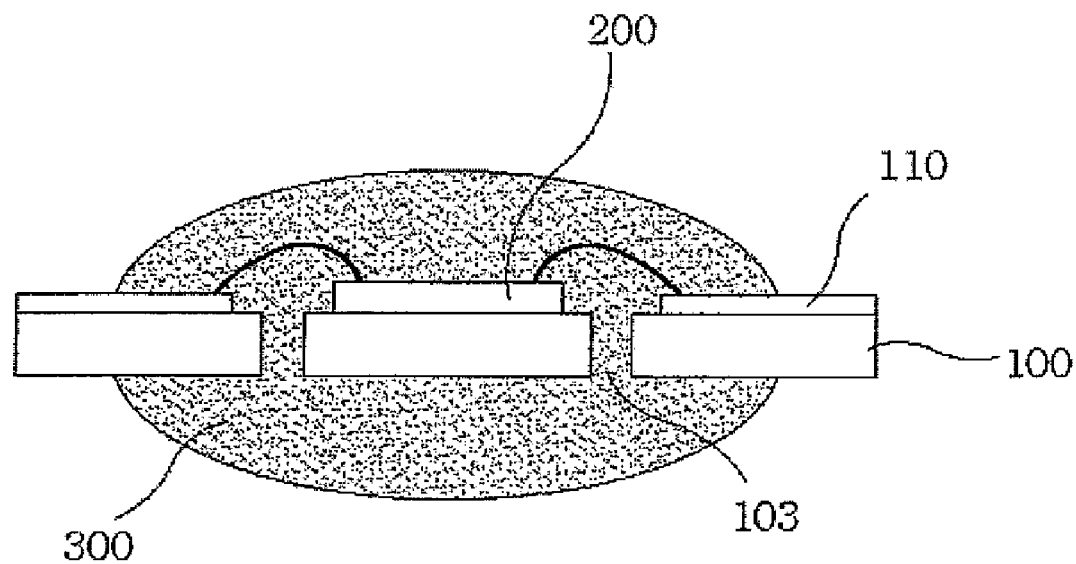

In order to protect the semiconductor device 200 bonded on the fabric type PCB 100 against external environments such as electrical, physical, and chemical shocks and dusts and moisture, a molding unit 300 is formed. As illustrated in FIG. 4, via holes 103 can be formed in the fabric type PCB 100 on which the semiconductor device 200 is bonded. The molding unit 300 can be formed on and under the fabric type PCB 100 on which the via holes 103 and the semiconductor device 200 are bonded. The molding regions formed on and under the fabric type PCB 100 are connected to each other by the molding region formed in the via hole 103 of the fabric type PCB 100. Therefore, since the top surface and the bottom surface of the fabric type PCB 100 are connected to each other by the molding unit 300, the fabric type semiconductor device package 101 can stand pressure applied in a horizontal direction.

In the fabric type semiconductor device package according to the present invention, since the fabric type PCB formed of fabric is used to minimize a feeling of an alien substance. In addition, in the fabric type semiconductor device package, endurance against the pressure in the horizontal direction can be improved by the molding unit formed so that the top surface and the bottom surface of the fabric type PCB are connected to each other.

Hereinafter, a method of installing the fabric type semiconductor device package according to the embodiment of the present invention will be described with reference to the attached drawings.

Figure 5:
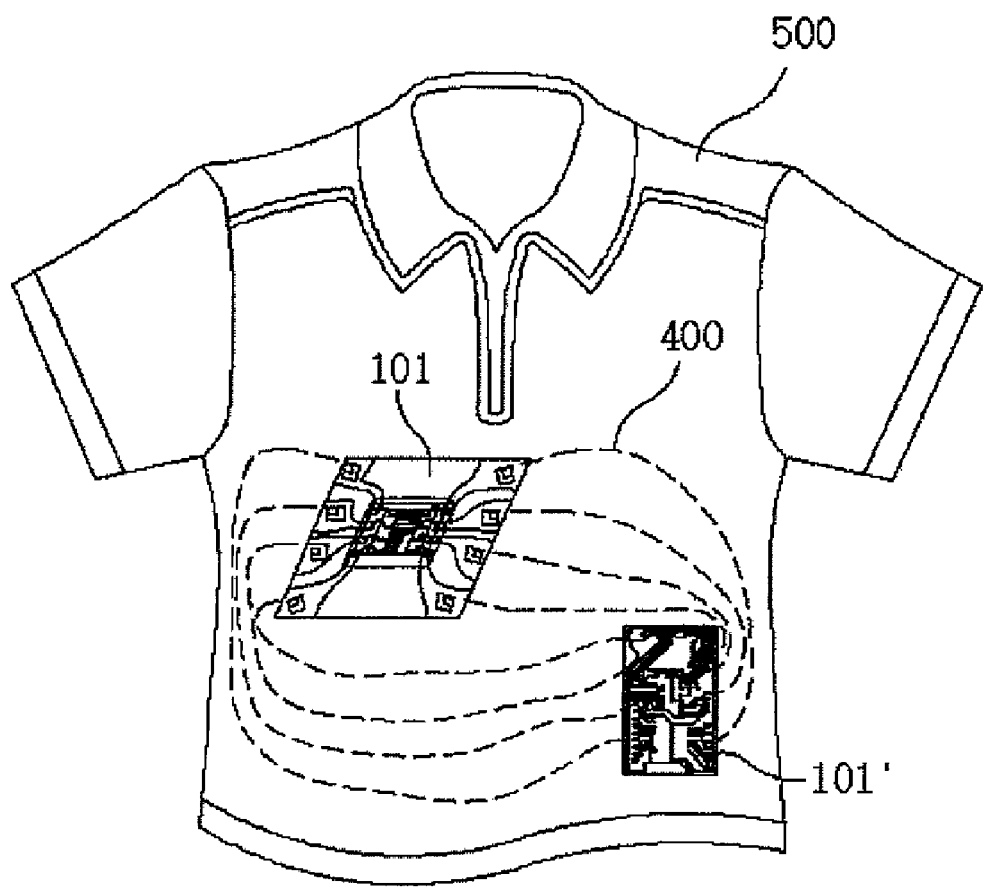
FIGS. 5 and 6 illustrate a method of installing the fabric type semiconductor device package according to the embodiment of the present invention.

FIGS. 5 and 6 illustrate a method of installing the fabric type semiconductor device package according to the embodiment of the present invention.

FIG. 5 illustrates fabric type semiconductor device packages installed in clothes according to the embodiment of the present invention.

Referring to FIG. 5, respective fabric type semiconductor device packages 101 and 101' are installed in clothes 500 by sewing a fabric type PCB on the clothes 500 using a conductive fiber 400.

FIG. 6 illustrates a method of electrically connecting the fabric type semiconductor device packages 101 and 101' arranged on the clothes 500 by a distance to each other.

Figure 6A:
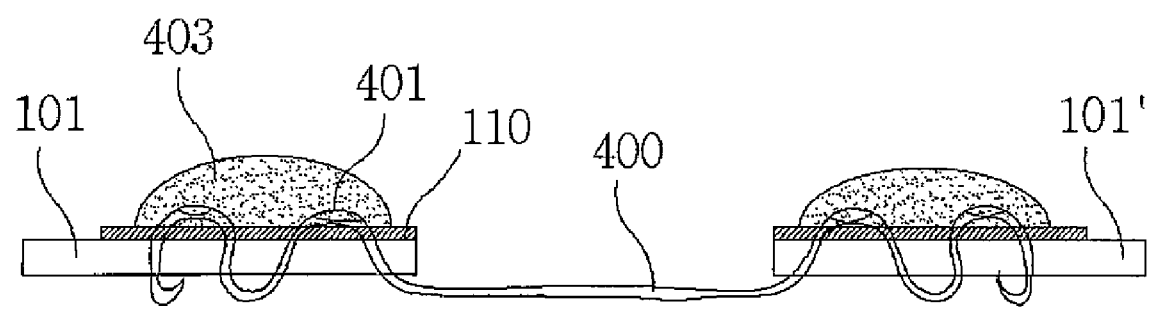

Referring to FIG. 6A, firstly the respective fabric type semiconductor device packages 101 and 101' may be sewed on the clothes by the conductive fiber 400. A coating layer of the conductive fiber 400 may be removed by a knife or laser such that some conductor 401 of the conductive fiber 400 sewed on the clothes can be exposed. After that, the exposed portion of the conductor 401 and the lead unit 110 of the semiconductor device packages 101 are bonded to each other by a conductive adhesive 403. Moreover, the conductive fiber 400 connected to the fabric type semiconductor device packages 101 may be connected to another fabric type semiconductor device packages 101' in the same way as described as above.

Figure 6B:
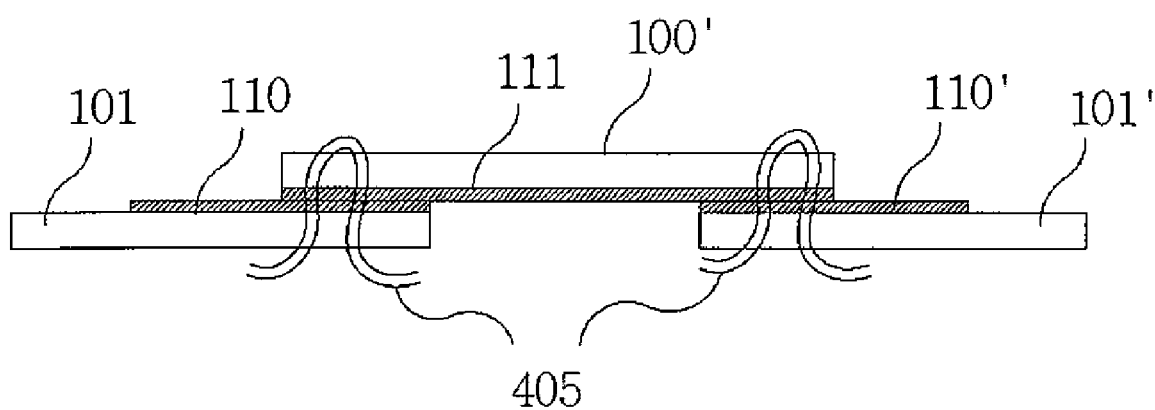

Referring to FIG. 6B, the respective fabric type semiconductor device packages 101 and 101' may be electrically connected to each other by a fabric type PCB 100' in which a lead pattern 111 is formed. Firstly, the each lead unit 110 and 110' which are formed in the respective fabric type semiconductor device packages 101 and 101' are made to contact the lead pattern 111 formed in the fabric type PCB 100'. After that, the lead pattern 111 and the each lead unit 110 and 110' are sewed to each other using the fabric 405. By doing so, the respective fabric type semiconductor device packages 101 and 101' which are installed in the clothes are electrically connected to each other.

Therefore, the respective fabric type semiconductor device packages 101 and 101' as illustrated in FIG. 5 are not only electrically connected to each other by the conductive fiber 400 but are installed on the clothes 500.

The method of installing fabric type semiconductor device packages according to the embodiment of the present invention is effective to easily install the fabric type semiconductor device packages on clothes.

Hereinafter, a manufacturing method of a fabric type semiconductor device package according to an embodiment of the present invention will be described with reference to the accompanying drawings.

FIGS. 7 to 12 illustrate a method of manufacturing a fabric type semiconductor device package according to the embodiment of the present invention.

Referring to FIGS. 7 to 12, the manufacturing method of a fabric type semiconductor device package according to the embodiment of the present invention comprises a fabric type PCB 100 forming operation of forming the lead unit 110 by patterning conductive material on clothes, an operation of bonding electrode unit 210 of the semiconductor devices 200 to the lead unit 110 of the fabric type PCB 100, and an operation of forming a molding unit 300 for sealing the fabric type PCB 100 and the semiconductor devices 200.

Operation of Forming a Fabric Type PCB

Figure 7:
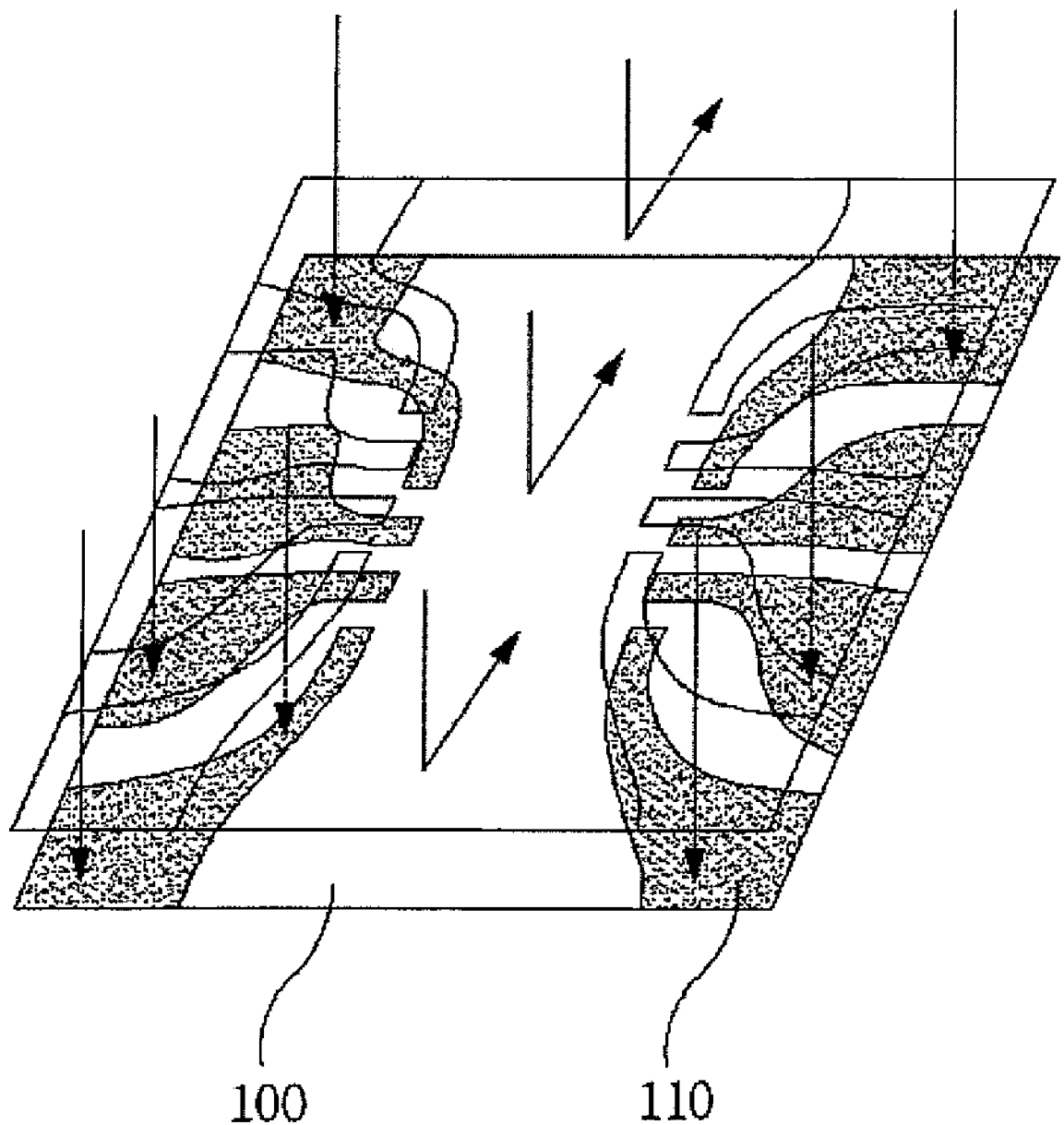
FIGS. 7 to 12 illustrate a method of manufacturing the fabric type semiconductor device package according to the embodiment of the present invention.

FIG. 7 illustrates the method of manufacturing the fabric type semiconductor device package 100 according to the embodiment of the present invention.

Referring to FIG. 7, the operation of forming the fabric type PCB 100 comprises an operation of forming the lead unit 110 by patterning the conductive material on clothes. Firstly, a screen mask having a pattern corresponding to the pattern of the lead unit 110 is arranged on the clothes. After that, the conductive material is coated on the surface of the screen mask arranged on the clothes. At this time, the conductive material is vapor-deposited on the clothes through the pattern of the screen mask. The conductive material that is vapor-deposited on the fabric is formed as the lead unit 110 having a desired pattern. Due to this, the fabric type PCB 100 in which the lead unit 110 is formed can be formed. The conductive material used to form the lead unit 110 of the fabric type PCB 100 may comprise silver, polymer, solvent, polyester, and cyclohexanone.

According to another method of forming the lead unit 110 of the fabric type PCB 100, sputtering gas collides against a target material in a high vacuum status to generate plasma. After that, the plasma is sprayed on the fabric through a mask with a patter corresponding to the patter of the lead unit 110. By doing so, the lead unit 110 with a desired pattern is formed on the clothes so that the fabric type PCB 100 is provided. Here, the lead unit 110 formed in the fabric type PCB 100 may comprise the conductive material.

Figure 8:
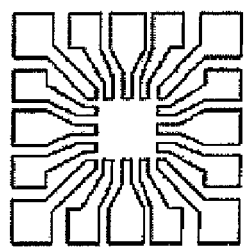
Figure 8:
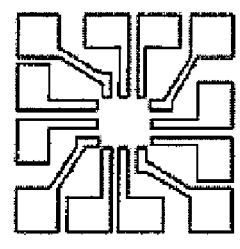
Figure 8:
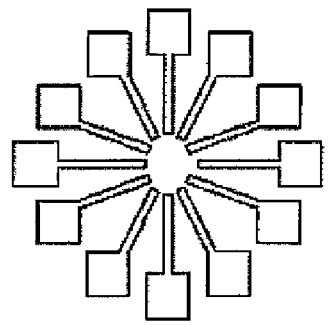
Figure 8:
Figure 8:
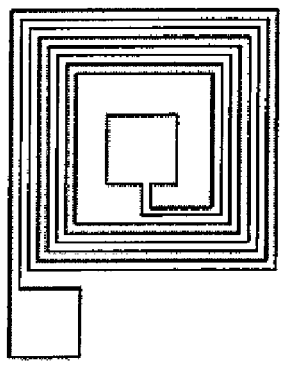
Figure 8:
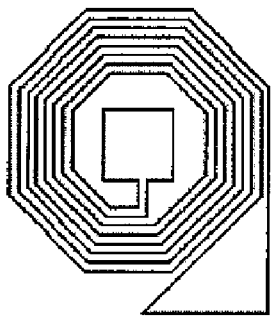
Figure 8:
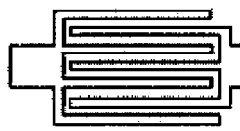
Figure 8:
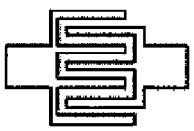
Figure 8:
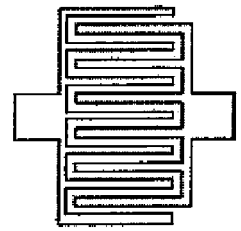
Figure 8:
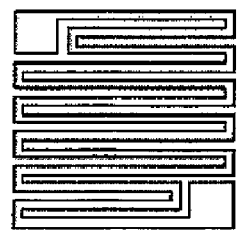

FIG. 8 illustrates various passive devices which can be implemented by the fabric PCB. The fabric type PCB to which a semiconductor device described later may be implemented by a 16-pin pad 13, 12-pin pads 15 and 17, a wire 21, inductors 23 and 25, capacitors 27, 29, and 31, and a resistor 33.

Operation of Bonding a Semiconductor Device to a Fabric Type PCB

Figure 9:
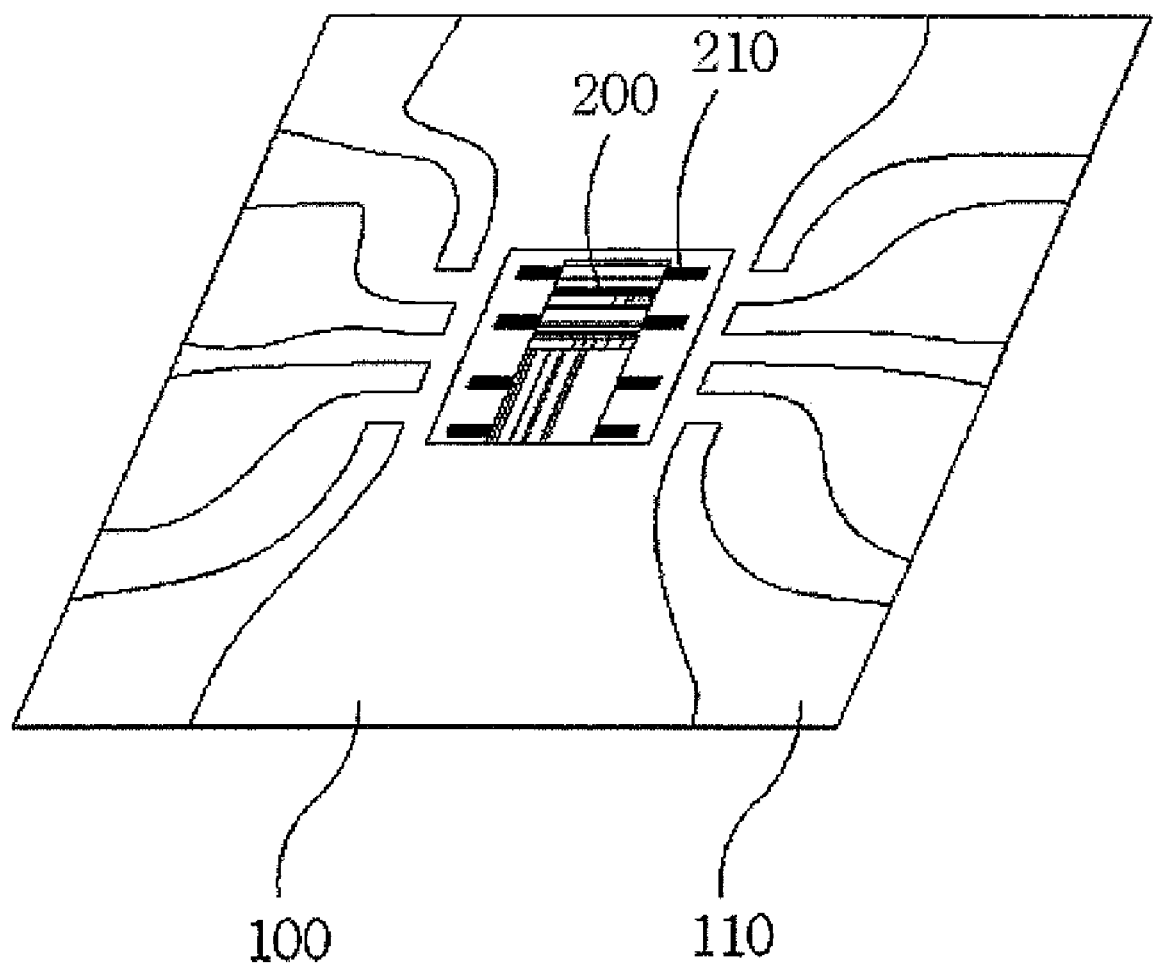

FIGS. 9 to 11 illustrate a method of bonding the semiconductor devices to the fabric type PCB according to the embodiment of the present invention.

Referring to FIGS. 9 and 10, the semiconductor device 200 and the fabric type PCB 100 are bonded to each other in a wire bonding fashion that the electrode unit 210 of the semiconductor device 200 and the lead unit 110 of the fabric type PCB 100 are bonded to each other by the wire 220. The semiconductor device to be bonded to the fabric type PCB 100 may comprise at least one of a semiconductor chip, a passive device, and IC chipset.

In a case where the semiconductor device 200 is bonded to the fabric type PCB 100, the bonding cannot be easily carried out because of the flexibility of the fabric type PCB 100. In order to solve this problem, firstly a region of the fabric type PCB 100 to which the semiconductor device 200 is bonded may be coated with liquid epoxy. After that, as illustrated in FIG. 9, the semiconductor device 200 is fixed on the fabric type PCB 100 coated with the liquid epoxy.

Figure 10A:
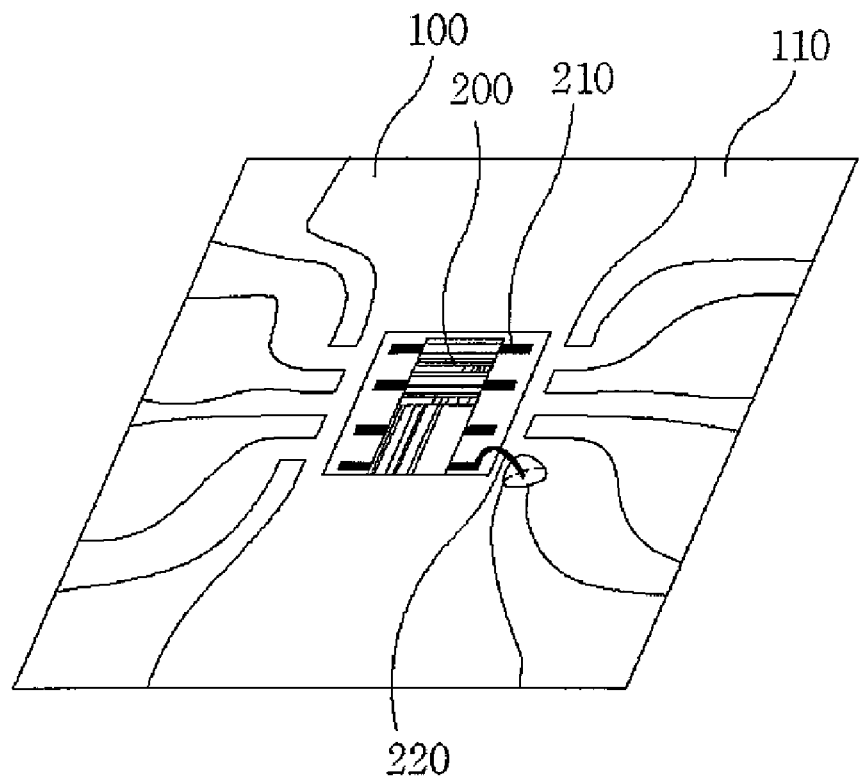
Figure 10B:
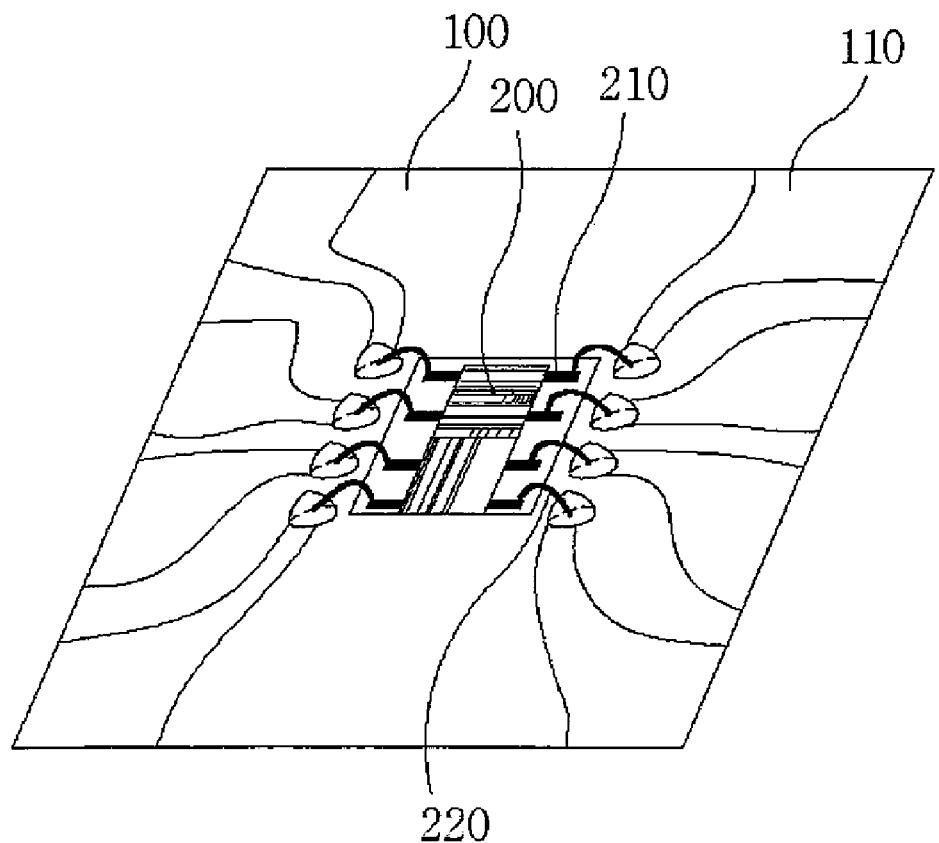

After that, as illustrated in FIG. 10A, ends of the wires are firstly bonded to the electrode unit 210 of the semiconductor devices 200. Then, the other ends of the wires 200 bonded to the electrode unit 210 are secondly bonded to the lead unit 110 of the fabric type PCB 100. Here, a first bonding and a second bonding are performed by considering the respective electrodes of the electrode unit 210 and the respective leads of the lead unit 110 as a bonding unit, and other electrodes and leads may be bonded to each other by the first bonding and the second bonding. By doing so, as illustrated in FIG. 10B, the semiconductor device 200 is bonded to the fabric type PCB 100 by the wires.

Moreover, when the semiconductor device and the fabric type PCB 100 are bonded to each other in the wire bonding, firstly a metal plate may be bonded to the lead unit 110 of the fabric type PCB 100. After that, the semiconductor device may be bonded to the metal plate bonded to the lead unit 110. After that, the metal plate which is bonded to the electrode unit 210 of the semiconductor device 200 the fabric type PCB 100 may be bonded by the first bonding and the second bonding in the same manner as the above mentioned wire bonding fashion.

Figure 11A:
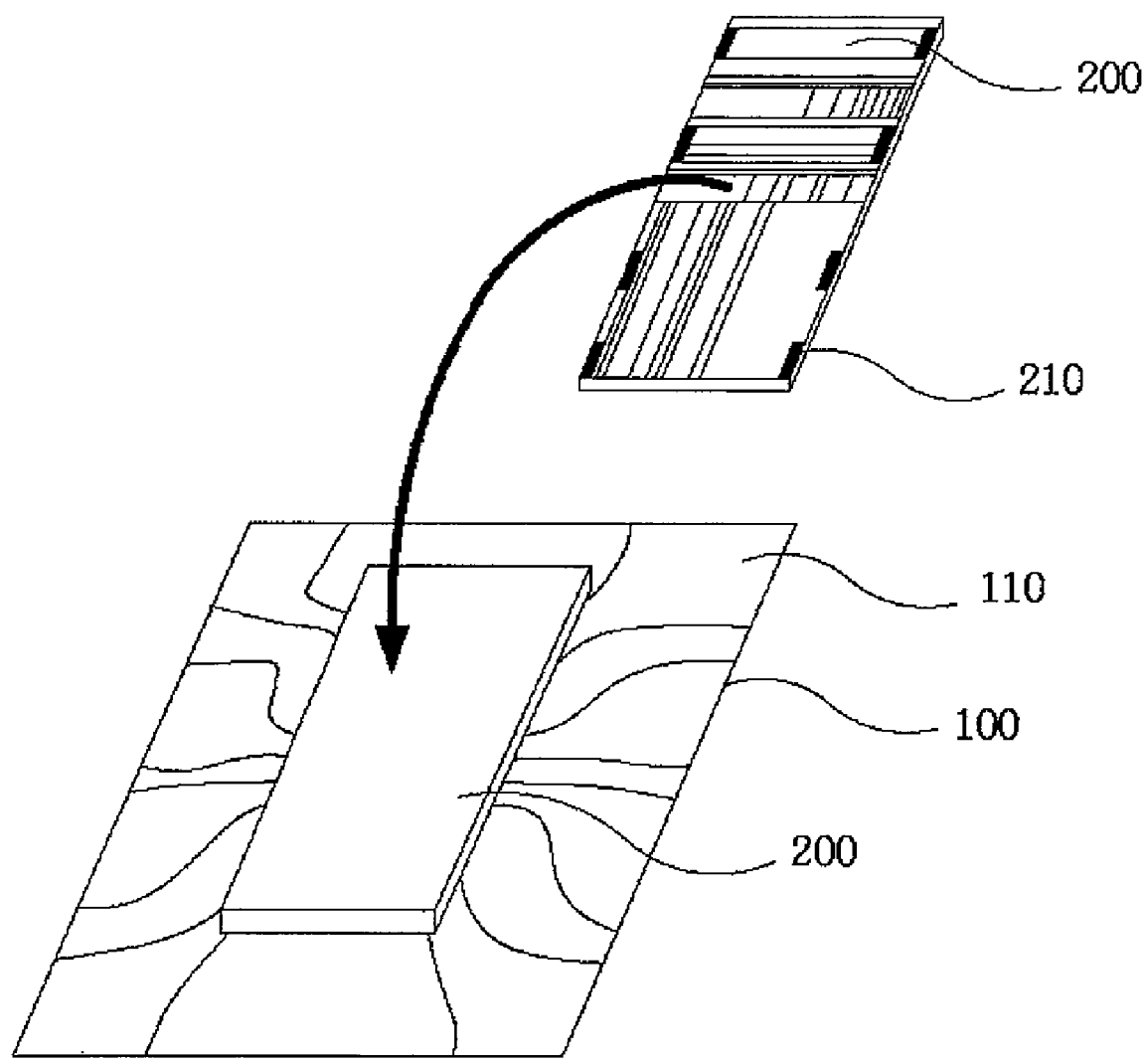
Figure 11B:
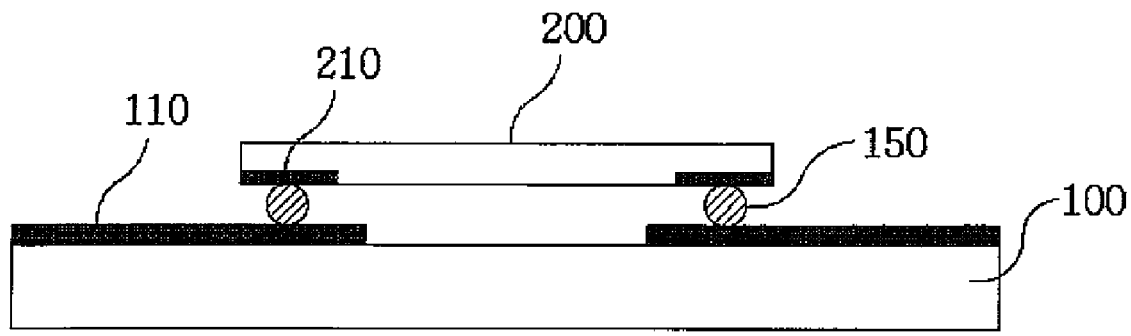

Referring to FIG. 11A, the electrode unit 210 of the semiconductor device 200 and the lead unit 110 of the fabric type PCB 100 may be bonded to each other by a flip chip fashion. In the flip chip fashion, as illustrated in FIG. 11B, the semiconductor device 200 and the fabric type PCB 100 are electrically connected to each other by a protrusion 150 formed on the lead unit 110 of the fabric type PCB 100 or the electrode unit 210 of the semiconductor device 200.

Operation of Forming a Molding Unit

FIG. 12 illustrates the method of forming the molding unit of a fabric type semiconductor device package according to the embodiment of the present invention.

Figure 12A:
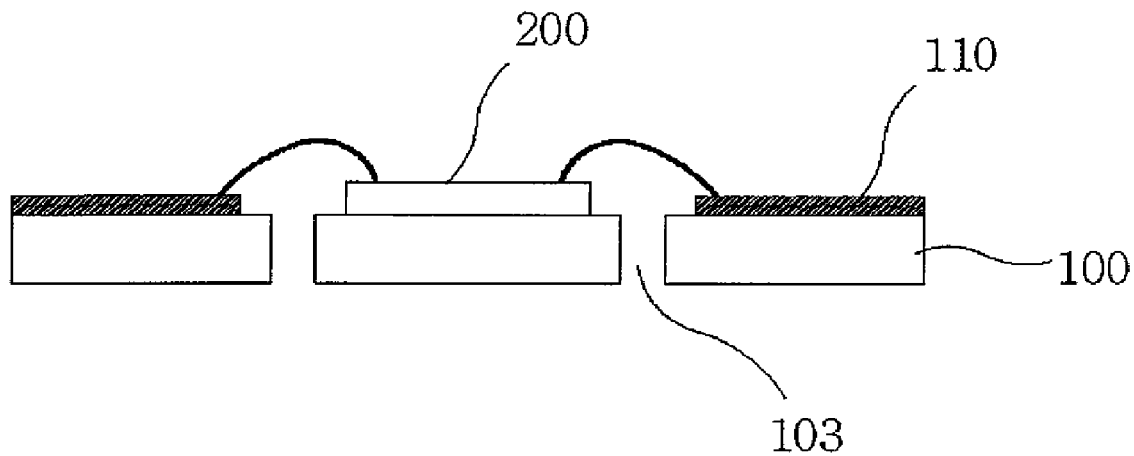
Figure 12B:
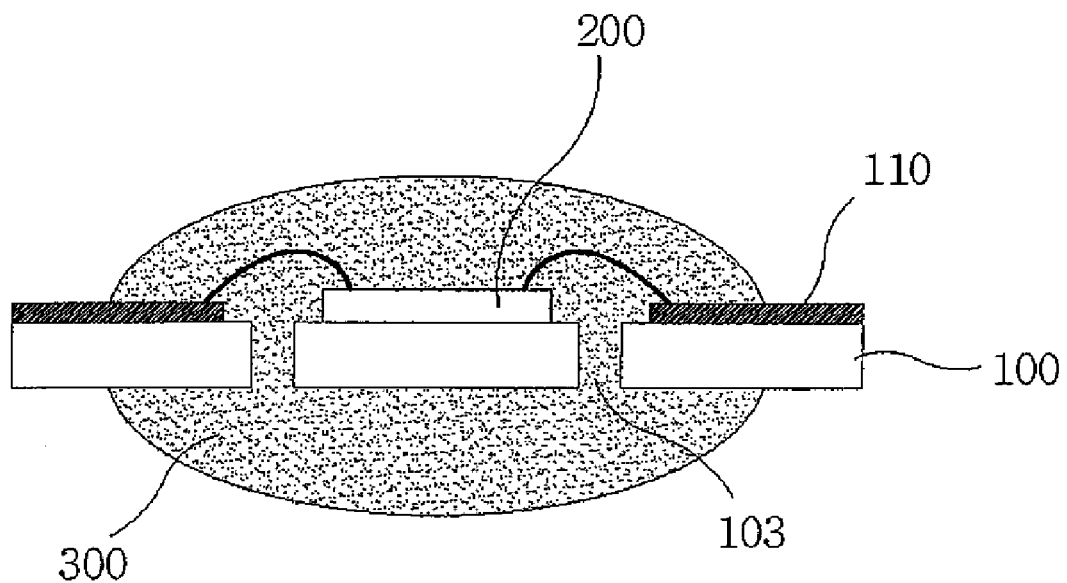

Referring to FIG. 12A, a plurality of holes 103 are formed in the fabric type PCB to which the semiconductor device 200 is bonded. After that, as illustrated in FIG. 12B, liquid molding compound is vapor-deposited. The liquid molding compound socks through the holes 103 of the fabric type PCB 100 to which the semiconductor device 200 is bonded. By doing so, the molding unit 300 may be formed such that the upper and lower sides of the fabric type PCB 100 are connected to each other. In other words, respective molding regions which are formed in the upper side and the lower side of the fabric type PCB 100 may be connected to each other to form a single molding region due to the molding regions which are formed in the holes. The molding unit 300 is formed such that the upper and lower sides thereof are connected to each other so that the fabric type semiconductor device package 101 can endure a horizontal pressure more effectively.

The invention being thus described, it will be obvious that the same may be varied in many ways. Such variations are not to be regarded as a departure from the spirit and scope of the invention and all such modifications as would be obvious to one skilled in the art are intended to be included within the scope of the following claims.

What is claimed is:

1. A fabric type semiconductor device package, comprising:
   a fabric type printed circuit board comprising a fabric and a lead unit formed by patterning a conductive material on the fabric;
   a semiconductor device comprising an electrode unit bonded to the lead unit of the fabric type printed circuit board; and
   a molding unit for sealing the fabric type printed circuit board and the semiconductor device.

2. The fabric type semiconductor device package of claim 1, wherein the electrode unit of the semiconductor device and the lead unit of the fabric type printed circuit board are wire-bonded to each other.

3. The fabric type semiconductor device package of claim 1, further comprising a metal plate formed on the lead unit of the fabric type printed circuit board, wherein
   the electrode unit of the semiconductor device and the metal plate of the fabric type printed circuit board are wire-bonded to each other.

4. The fabric type semiconductor device package of claim 1, wherein the electrode unit of the semiconductor device or the lead unit of the fabric type printed circuit board comprises a protrusion, and the electrode unit of the semiconductor device and the lead unit of the fabric type printed circuit board are flip chip-bonded to each other.

5. The fabric type semiconductor device package of claim 1, wherein the semiconductor device comprises at least one of a semiconductor device chip, a passive device, and an IC chipset.

6. The fabric type semiconductor device package of claim 1, wherein the fabric type printed circuit board comprises a via hole;
   the molding unit is formed in the via hole, and the upper and lower sides of the fabric type printed circuit board; and
   a molding region formed in the upper side of the fabric type printed circuit board and a molding region formed in the lower side of the fabric type printed circuit board are connected to each other by a molding region formed in the via hole.

7. A method of installing the fabric type semiconductor device package of one of claims 1 on clothes by sewing the fabric type printed circuit board on the clothes using a conductive fiber.

8. The method of installing a fabric type semiconductor device package of claim 7, wherein a step of installing the fabric type semiconductor device package comprises:
   removing a coating layer of the conductive fiber using a knife or laser such that a part of a conductor of the conductive fiber which is sewed on the clothes is exposed; and
   bonding the exposed conductor to the lead unit of the fabric type printed circuit board with a conductive adhesive.

9. The method of installing a fabric type semiconductor device package of claim 7, wherein a step of installing the fabric type semiconductor device package comprises sewing the lead unit of the fabric type printed circuit board, to which the semiconductor device is bonded, to a lead pattern of another fabric type printed circuit board with the fiber when the lead unit of the fabric type printed circuit board contacts the lead pattern of another fabric type printed circuit board.

10. A method of manufacturing a fabric type semiconductor device package comprising:
    (a) forming a fabric type printed circuit board comprising forming a lead unit by patterning a conductive material on a fabric;
    (b) bonding an electrode unit of a semiconductor device to the lead unit of the fabric type printed circuit board; and
    (c) forming a molding unit of sealing the fabric type printed circuit board and the semiconductor device.

11. The method of manufacturing a fabric type semiconductor device package of claim 10, wherein the forming of the lead unit comprises:
    arranging a screen mask with a pattern corresponding to a pattern of the lead unit on the fabric; and
    coating the conductive material on the fabric through the screen mask.

12. The method of manufacturing a fabric type semiconductor device package of claim 11, wherein the conductive material comprises silver, polymer, solvent, polyester, and cyclohexanone.

13. The method of manufacturing a fabric type semiconductor device package of claim 10, wherein the forming of the lead unit comprises:
    generating plasma by colliding a sputtering gas against a target material in a high vacuum status; and
    vapor-depositing the plasma on the fabric type printed circuit board through a mask with a pattern corresponding to the pattern of the lead unit.

14. The method of manufacturing a fabric type semiconductor device package of claim 10, wherein the semiconductor device comprises at least one of a semiconductor chip, a passive device, and an IC chipset.

15. The method of manufacturing a fabric type semiconductor device package of claim 10, wherein the step (b) comprises:
    coating a liquid epoxy on the fabric type printed circuit board;
    bonding the semiconductor device on the fabric type printed circuit board coated with the liquid epoxy and bonding a wire to the electrode unit of the semiconductor device; and
    bonding the wire bonded to the electrode unit of the semiconductor device to the lead unit of the fabric type printed circuit board.

16. The method of manufacturing a fabric type semiconductor device package of claim 10, wherein the step (b) comprises:

bonding a metal plate to the lead unit of the fabric type printed circuit board and bonding the semiconductor device to the metal plate;

bonding a wire to the electrode unit of the semiconductor device bonded to the metal plate; and bonding the wire bonded to the electrode unit of the semiconductor device to the metal plate.

17. The method of manufacturing a fabric type semiconductor device package of claim 10, wherein, in the step (b), the lead unit of the fabric type printed circuit board and the electrode unit of the semiconductor device are flip chip-bonded to each other.

18. The method of manufacturing a fabric type semiconductor device package of claim 10, wherein the step (c) comprises:

forming a plurality of holes in the fabric type printed circuit board to which the semiconductor device is bonded; and forming the molding unit such that the upper and lower sides of the fabric type printed circuit board to which the semiconductor device is bonded are connected to each other through the holes.

* * * * *